United States Patent [19]
Carpenter et al.

[11] Patent Number: 5,902,491
[45] Date of Patent: May 11, 1999

[54] METHOD OF REMOVING SURFACE PROTRUSIONS FROM THIN FILMS

[75] Inventors: Craig M. Carpenter; James J. Alwan, both of Boise, Id.

[73] Assignee: Micron Technology, Inc., Boise, Id.

[21] Appl. No.: 08/726,955

[22] Filed: Oct. 7, 1996

[51] Int. Cl.$^6$ .............................. H01L 29/12; H01L 29/06
[52] U.S. Cl. .................. 216/2; 257/10; 313/495
[58] Field of Search .................................. 257/10; 216/2

[56] References Cited

U.S. PATENT DOCUMENTS

| | | | |
|---|---|---|---|
| 4,940,916 | 7/1990 | Borel et al. | 313/306 |
| 5,186,670 | 2/1993 | Doan et al. | 445/24 |
| 5,210,472 | 5/1993 | Casper et al. | 315/349 |
| 5,229,331 | 7/1993 | Doan et al. | 437/228 |
| 5,252,881 | 10/1993 | Muller | 310/309 |
| 5,259,799 | 11/1993 | Doan et al. | 445/24 |
| 5,372,973 | 12/1994 | Doan et al. | 437/228 |
| 5,445,107 | 8/1995 | Roth | 117/8 |
| 5,620,350 | 4/1997 | Takemura | 445/50 |
| 5,629,580 | 5/1997 | Mandelman | 313/310 |

OTHER PUBLICATIONS

Wolf. et al. "Silicon processing for the vlsi era" Lattice Press pp. vii–xxiv, 1986.

*Primary Examiner*—Ceila Chang
*Attorney, Agent, or Firm*—Seed and Berry LLP

[57] ABSTRACT

A method for removing a surface protrusion projecting from a layer of a first material deposited on a surface of a substrate. In accordance with one embodiment of the invention, a layer of a second material is applied on the layer of first material. A sufficient quantity of the second material is removed to expose the surface protrusion. The first material exposed through the surface protrusion is then removed.

64 Claims, 1 Drawing Sheet

METHOD OF REMOVING SURFACE PROTRUSIONS FROM THIN FILMS

STATEMENT OF GOVERNMENT INTEREST

This invention was made with Government support under Contract No. DABT63-93-C-0025 ordered by Advanced Research Projects Agency (ARPA). The Government has certain rights in this invention.

TECHNICAL FIELD

The present invention is directed generally to the formation of a layer on a substrate and specifically to removing surface protrusions from such a layer which inherently occur during its formation.

BACKGROUND OF THE INVENTION

Processes for depositing a thin film layer on a substrate are known in the art. An example of one such process is physical vapor deposition (PVD). Inherent in the PVD process is the formation of surface protrusions on the thin film during deposition of the material forming the thin film. These surface protrusions can be many times the size of components to be later deposited on the thin film. As a result, the surface protrusions may project into layers of material formed on the thin film layer. In such cases, the surface protrusions may result in an unwanted short circuit between the thin film layer and a layer formed on top of the thin film layer. For example, in the baseplate of a field emission display (FED), such surface protrusions could result in a short circuit between the thin film layer on which emitters are formed and an extraction grid positioned above the emitters. This is true because a surface protrusion can have a height which is much greater than the height of an insulating layer positioned between the thin film layer and the extraction grid.

Various techniques have been attempted in the prior art in an effort to alleviate the adverse effects of surface protrusions. First, the parameters of the PVD process have been adjusted to try and prevent formation of the surface protrusions. This technique has not been entirely successful in that some surface protrusions are inherently formed during the PVD process. Given that some surface protrusions are formed, chemical-mechanical planarization (CMP) has been utilized to try and remove these protrusions from the thin film layer. When CMP is used directly on the thin film layer, however, the larger surface protrusions sometimes break lose and scratch the surface of the thin film layer. These scratches can result in unacceptably large areas of the thin film being unsuitable for the formation of the desired components.

In view of the problems associated with these processes for removing surface protrusions from a thin film, it is desirable to develop a process which removes the surface protrusions from the thin film without detrimentally affecting the surface of the thin film layer.

SUMMARY OF THE INVENTION

The present invention is a method for removing a surface protrusion projecting from a layer of a first material deposited on a surface of a substrate. In one embodiment, the method comprises the steps of applying a layer of a second material on the layer of first material. A sufficient quantity of the second material is removed to expose the protrusion. The first material exposed through the protrusion is then removed.

The step of removing a sufficient quantity of the second material to expose the protrusion can comprise mechanical planarization of the second material, chemical mechanical planarization of the second material, or can comprise the steps of removing the second material above a predetermined distance from the surface of the substrate so that the thickness of the second material above the first material is greater adjacent the protrusion than above the protrusion and isotropically removing the second material to expose the protrusion.

In accordance with another embodiment of the present invention, a field emission display (FED) is constructed from a process comprising the following steps. First, a thin film layer is deposited on a substrate. The thin film layer may have one or more surface protrusions. The thin film layer is covered with a sacrificial layer having a top surface. Through a leveling material removal process, such as chemical-mechanical planarization, a portion of the top surface of the sacrificial layer is removed until the sacrificial layer has a predetermined thickness D to thereby expose on the top surface all surface protrusions having a height of at least D. The exposed surface protrusions are then etched to remove the surface protrusions from the thin film layer. The sacrificial layer is etched to remove the sacrificial layer from the thin film layer. Emitters are then constructed on the thin film layer, and an extraction grid is formed above the emitters. Finally, a screen is constructed above the extraction grid, the screen having a phosphor-coated surface facing the extraction grid.

DETAILED DESCRIPTION OF THE INVENTION

Figure 1:
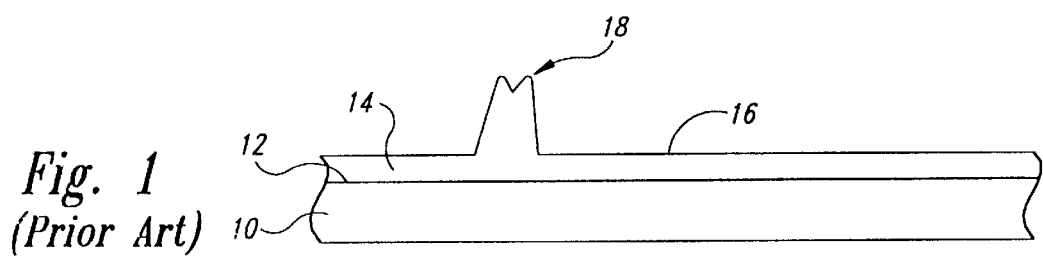
FIG. 1 is a cross-sectional view of a substrate with a thin film layer having surface protrusions deposited on the substrate.

FIG. 1 illustrates a substrate 10 having a top surface 12. The substrate 10 may be glass or other materials known in the art which are suitable for use as a substrate. A thin film layer 14 is deposited on the top surface 12 of the substrate 10. The thin film layer 14 may be a conductive layer on which are formed elements of a device, such as a field emission display baseplate. In one embodiment, the thin film layer 14 is chromium. Other suitably conductive materials can also be used. The depositing of the thin film layer 14 may be done using any of a number of processes known in the art, such as physical vapor deposition (PVD). Inherent in many of these processes is the unwanted formation of surface protrusions 18 on the top surface 16 of the thin film layer 14. Only one surface protrusion 18 is shown in FIG. 1, but in reality such protrusions may be scattered randomly over the entire surface 16 of the thin film layer 14.

Figure 2:
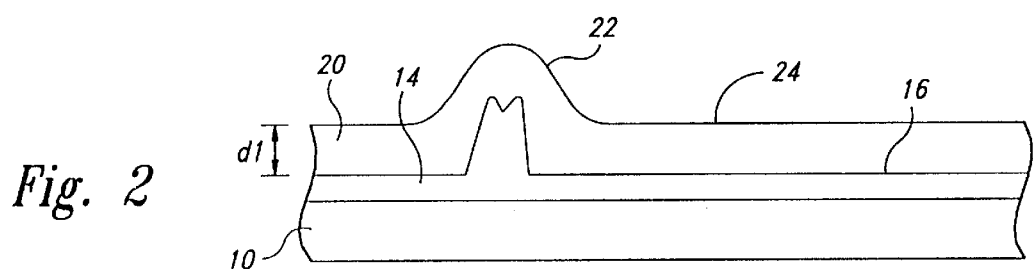
FIG. 2 is a cross-sectional view of the substrate and thin film layer of FIG. 1 showing a sacrificial layer deposited on the thin film layer.

FIG. 2 shows the first step of the process of the preferred embodiment of the present invention in which a sacrificial layer 20 is deposited on the top surface 16 of the thin film layer 14. The sacrificial layer 20 typically consists of a material which is selectively removable from the thin film layer 14. In one embodiment of the present invention, the sacrificial layer 20 consists of silicon dioxide. The sacrificial layer 20 shown in FIG. 2 is deposited as a conformal layer on the thin film layer 14. The sacrificial layer 20 need not, however, be a conformal layer. If the sacrificial layer 20 is not a conformal layer, the surface protrusion 18 may extend above the top surface of the sacrificial layer (see FIG. 3). The sacrificial layer 20 may be deposited so that it has a predetermined thickness d1 above the top surface 16 of the thin film layer 14.

Figure 3:
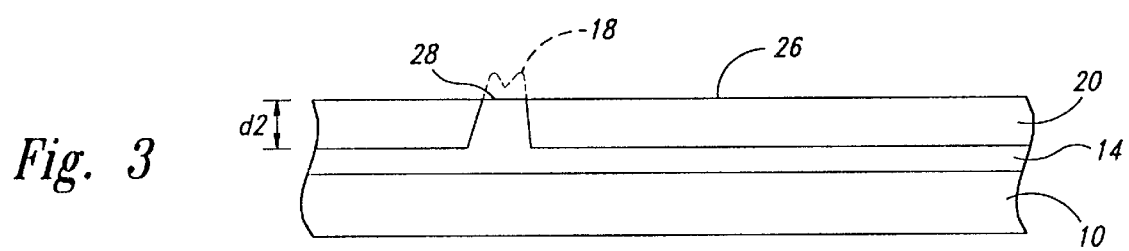
FIG. 3 is a cross-sectional view showing the sacrificial layer after it had been planarized to remove the tips of the surface protrusions.

A bump 22 is formed on the top surface 24 of the sacrificial layer 20 wherever there is a surface protrusion 18 on the thin film layer 14. These bumps 22 are removed from the surface 24 by mechanical planarization or chemical-mechanical planarization (CMP). Although CMP is discussed as the preferred method used to remove the bump 22, one skilled in the art will realize that other known processes can also be utilized. The CMP process is performed until a sufficient amount of the sacrificial layer 20 has been removed to expose the tip of the surface protrusion 18. FIG. 3 shows the sacrificial layer 20 having a planarized surface 26 after the CMP process is complete. The tip of the surface protrusion 18—illustrated by the dotted line—is removed by the CMP process. The removal of the tip of the surface protrusion 18 results in an island 28 of the material comprising the thin film layer 14 being exposed on the planarized surface 26. Such islands 28 occur wherever there was a surface protrusion 18 on the thin film layer 14 having a height greater than d2.

Figure 4:
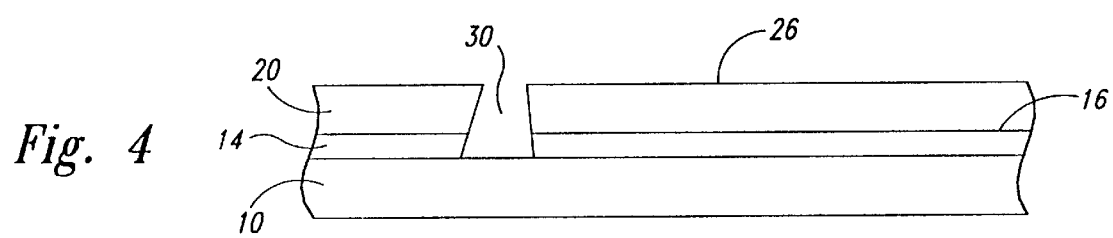
FIG. 4 is a cross-sectional view of the substrate of FIGS. 1–3 showing the removal of the surface protrusions from the thin film layer.

The next step of the present process is the removal of the surface protrusions 18 as shown in FIG. 4. The surface protrusions 18 are removed from the thin film layer 14 through a process, such as etching, which is known in the art. An etchant is disposed on the planarized surface 26. The etchant is preferably chosen so that it will selectively remove the material of the protrusions 18 exposed through the island 28 to a greater degree than the material of the sacrificial layer 20. In this way, the sacrificial layer 20 protects the portions of the thin film layer 14 not having surface protrusions 18 while allowing removal of the surface protrusions. The etching process results in a void 30, which is the space formerly occupied by the surface protrusion 18.

Figure 5:
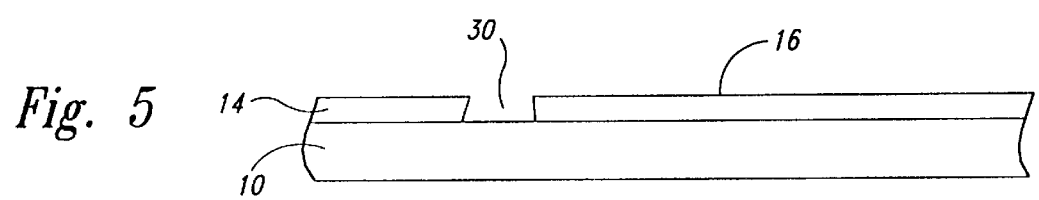
FIG. 5 is a cross-sectional view of the substrate and thin film layer of FIGS. 1–4 depicting the thin film layer after its surface protrusions have been removed in accordance with the preferred embodiment of the present invention.

In FIG. 5, the sacrificial layer 20 is removed from the top surface 16 of the thin film 14. This removal of the sacrificial layer 20 may be accomplished using known etching processes. In the etching process, an etchant is preferably used which selectively removes the material of the sacrificial layer 20 to a greater degree than the material of the thin film layer 14. A CMP process could alternatively be used to remove the sacrificial layer 20. The CMP process will not harm the top surface 16 of the thin film layer 14 since the large surface protrusions 18 (i.e., having a height of at least d2) have been removed from the thin film layer. Although the sacrificial layer 20 is depicted and described as being removed from the thin film layer 14, the sacrificial layer need not always be removed. For example, if the sacrificial layer 20 is an insulating layer which is part of the device being fabricated, the sacrificial layer could remain and further layers deposited on the top surface 26 of the sacrificial layer.

It should be noted that after the process of the present invention has been performed on the thin film layer 14, the thin film layer has a void 30 in the same location where a surface protrusion 18 was previously located. Such voids 30, however, generally do not adversely affect the utility of the thin film layer 14. These voids 30 occupy a small percentage of the total surface area of the thin film layer 14, which means the remaining area can be utilized for the formation of the desired elements on the thin film layer. Furthermore, the voids 30 do not pose the threat of short circuiting, as did the surface protrusions 18, to layers disposed above the surface 16 of the thin film layer 14.

The present invention has particular utility in the area of processing field emission displays and flat panel displays. In addition, the process is well suited for application to large area substrates in the range of twelve inches.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method for removing a surface protrusion that may project from a layer of a first conductive material deposited on a surface of a substrate, comprising:

applying a layer of a second material on the layer of first conductive material;

removing a sufficient quantity of the second material to expose any surface protrusion projecting from the layer of first conductive material; and removing the first conductive material through any such exposed surface protrusion.

2. The method of claim 1 wherein the step of removing the second material to expose the protrusion comprises mechanical planarization of the second material.

3. The method of claim 1 wherein the step of removing the second material to expose the protrusion comprises chemical mechanical planarization of the second material.

4. The method of claim 1 wherein the step of removing a sufficient quantity of the second material to expose the protrusion comprises:

removing the second material above a predetermined distance from the surface of the substrate so that the thickness of the second material above the first material is greater adjacent the protrusion than above the protrusion; and isotropically removing the second material to expose the protrusion.

5. The method of claim 1 wherein the step of removing the first material through the exposed protrusion comprises etching the first material through the exposed protrusion.

6. The method of claim 5 wherein the step of etching the first material through the exposed protrusion comprises applying an etchant to the protrusion that selectively removes the first material to a greater degree than the second material.

7. The method of claim 1 wherein the step of applying a layer of a second material on the layer of first material comprises applying a layer of the second material having a thickness that is less than the height of the projection.

8. The method of claim 1 wherein the step of applying a layer of a second material on the layer of the first material comprises conformally coating the first material with the second material.

9. A method for removing a surface protrusion that may project from a layer of a first conductive material deposited on a surface of a substrate, comprising:

applying a layer of a second material on the layer of first conductive material, including any such protrusion, the second material generally conformally coating the first material, including any such protrusion;

removing the second material from above any protrusion to a greater degree than from adjacent the protrusion;

removing a sufficient quantity of the second material to expose any such protrusion; and removing the first conductive material through the exposed protrusion.

10. The method of claim 9 wherein the step of removing the second material from above the protrusion to a greater degree than from adjacent the protrusion comprises mechanical planarization of the second material.

11. The method of claim 9 wherein the step of removing the second material from above the protrusion to a greater degree than from adjacent the protrusion comprises chemical mechanical planarization of the second material.

12. The method of claim 9 wherein the step of removing a sufficient quantity of the second material to expose the protrusion comprises isotropically removing the second material.

13. The method of claim 9 wherein the step of removing a sufficient quantity of the second material to expose the protrusion comprises mechanical planarization of the second material.

14. The method of claim 9 wherein the step of removing a sufficient quantity of the second material to expose the protrusion comprises chemical mechanical planarization of the second material.

15. The method material from wherein the steps of removing the second material from above the protrusion to a greater degree than from adjacent the protrusion and removing a sufficient quantity of the second material to expose the protrusion comprises mechanical planarization of the second material.

16. The method of claim 9 wherein the steps of removing the second material from above the protrusion to a greater degree than from adjacent the protrusion and removing a sufficient quantity of the second material to expose the protrusion comprises chemical mechanical planarization of the second material.

17. The method of claim 9 wherein the step of removing the first material through the exposed protrusion comprises etching the first material through the exposed protrusion.

18. The method of claim 17 wherein the step of etching the first material through the exposed protrusion comprises applying an etchant to the protrusion that selectively removes the first material to a greater degree than the second material.

19. The method of claim 9 wherein the step of applying a layer of a second material on the layer of first material comprises applying a layer of the second material having a thickness that is less than the height of the projection.

20. A method for removing a surface protrusion that may project from a layer of a first conductive material deposited on a surface of a substrate, comprising:

applying a layer of a second material on the layer of first conductive material, including any protrusion, the second material generally conformally coating the first conductive material, including the protrusion;

removing the second material above a predetermined distance from the surface of the substrate so that the thickness of the second material above the first material is greater adjacent the protrusion than above the protrusion;

removing a sufficient quantity of the second material to expose the protrusion; and removing the first conductive material through the exposed protrusion.

21. The method of claim 20 wherein the step of removing the second material above a predetermined distance from the surface of the substrate comprises mechanical planarization of the second material.

22. The method of claim 21 wherein the step of removing the second material above a predetermined distance from the surface of the substrate comprises chemical mechanical planarization of the second material.

23. The method of claim 20 wherein the step of removing a sufficient quantity of the second material to expose the protrusion comprises isotropically removing the second material.

24. The method of claim 20 wherein the step of removing a sufficient quantity of the second material to expose the protrusion comprises mechanical planarization of the second material.

25. The method of claim 20 wherein the step of removing a sufficient quantity of the second material to expose the protrusion comprises chemical mechanical planarization of the second material.

26. The method of claim 20 wherein the step of removing the first material through the exposed protrusion comprises etching the first material through the exposed protrusion.

27. The method of claim 26 wherein the step of etching the first material through the exposed protrusion comprises applying an etchant to the protrusion that selectively removes the first material to a greater degree than the second material.

28. The method of claim 20 wherein the step of applying a layer of a second material on the layer of first material comprises applying a layer of the second material having a thickness that is less than the height of the projection.

29. A method of coating a substrate with a thin film material having a relatively planar surface, comprising:

applying a layer of a first conductive material on the substrate in which the layer of first conductive material may have a surface protrusion;

applying a layer of a second material on the layer of first conductive material;

removing a sufficient quantity of the second material to expose any surface protrusion formed on the layer of first conductive material; and removing the first conductive material through the exposed protrusion.

30. The method of claim 29 wherein the step of applying a layer of a first material on the substrate comprises applying the first material to the substrate using physical vapor deposition.

31. The method of claim 29 wherein the step of removing a sufficient quantity of the second material to expose the protrusion comprises mechanical planarization of the second material.

32. The method of claim 29 wherein the step of removing the second material to expose the protrusion comprises chemical mechanical planarization of the second material.

33. The method of claim 29 wherein the step of removing a sufficient quantity of the second material to expose the protrusion comprises:

removing the second material above a predetermined distance from the surface of the substrate so that the thickness of the second material above the first material is greater adjacent the protrusion than above the protrusion;

isotropically removing the second material to expose the protrusion.

34. The method of claim 29 wherein the step of removing the first material through the exposed protrusion comprises etching the first material through the exposed protrusion.

35. The method of claim 34 wherein the step of etching the first material through the exposed protrusion comprises applying an etchant to the protrusion that selectively removes the first material to a greater degree than the second material.

36. The method of claim 29 wherein the step of applying a layer of a second material on the layer of first material comprises applying a layer of the second material having a thickness that is less than the height of the projection.

37. A method for removing surface protrusions from a conductive thin film layer deposited on a substrate, comprising the steps of:
   depositing on the conductive thin film layer a sacrificial layer having a top surface;
   removing a portion of the sacrificial layer from the top surface until the sacrificial layer has a predetermined thickness of D to thereby expose on the top surface all surface protrusions having a height of at least D; and
   removing the surface protrusions through the exposed portions of the protrusions.

38. The method of claim 37 wherein the sacrificial layer comprises silicon dioxide.

39. The method of claim 37 wherein the step of removing a portion of the sacrificial layer from the top surface includes the step of chemical-mechanical planarization (CMP) of the sacrificial layer.

40. The method of claim 37 wherein the step of removing the surface protrusions from the thin film layer includes the step of performing an etch to selectively remove the surface protrusions while leaving the sacrificial layer in tact.

41. The method of claim 37, further comprising the step of removing the sacrificial layer from the thin film layer.

42. The method of claim 41 wherein the step of removing the sacrificial layer from the thin film layer comprises the step of performing an etch to remove the sacrificial layer.

43. The method of claim 37 wherein the step of removing the sacrificial layer from the thin film layer comprises the step of chemical-mechanical planarization (CMP) to remove the sacrificial layer.

44. A method for removing a surface protrusion that may project from a layer of a conductive material deposited on a surface of a substrate, comprising:
   forming a layer of a second material on the layer of conductive material;
   removing a sufficient quantity of the second material to expose any surface protrusion projecting from the layer of conductive material;
   removing the conductive material through any such exposed surface protrusion;
   removing the second material to expose the layer of conductive material; and
   forming additional components on the exposed layer of conductive material.

45. The method of claim 44 wherein forming additional components on the exposed layer of conductive material comprises the process of fabricating components to form a field emission baseplate from the layer of conductive material.

46. The method of claim 44 wherein the conductive material comprises chromium.

47. The method of claim 44 wherein the layer of the second material comprises silicon dioxide.

48. The method of claim 44 wherein removing the second material to expose the surface protrusion comprises mechanical planarization of the second material.

49. The method of claim 44 wherein removing the second material to expose the surface protrusion comprises chemical mechanical planarization of the second material.

50. The method of claim 44 wherein removing the conductive material through any such exposed surface protrusion comprises the process of etching the conductive material.

51. The method of claim 44 wherein removing the second material to expose the layer of conductive material comprises the process of etching the second material.

52. A method for removing a surface protrusion that may project from a layer of a first conductive material deposited on a surface of a substrate, comprising:
   forming a layer of a second material on the layer of first conductive material;
   removing a sufficient quantity of the second material to expose any surface protrusion projecting from the layer of first conductive material;
   removing the first conductive material through any such exposed surface protrusion;
   removing the second material to expose the layer of first conductive material; and
   forming additional components on the exposed layer of first conductive material.

53. The method of claim 52 wherein forming additional components on the exposed layer of first conductive material comprises the process of fabricating components to form a field emission baseplate from the layer of first conductive material.

54. The method of claim 52 wherein removing the second material to expose the surface protrusion comprises mechanical planarization of the second material.

55. The method of claim 52 wherein removing the second material to expose the surface protrusion comprises chemical mechanical planarization of the second material.

56. The method of claim 52 wherein removing the layer of first conductive material through any such exposed surface protrusion comprises the process of etching the layer of first conductive material.

57. The method of claim 52 wherein removing the second material to expose the layer of first conductive material comprises the process of etching the second material.

58. A method for removing a plurality of surface protrusions that may project from a layer of a first conductive material deposited on a surface of a substrate, each protrusion having an associated unknown height, comprising:
   applying a layer of a second material on the layer of first conductive material;
   removing a sufficient quantity of the second material to expose any surface protrusions having heights of at least D;
   removing the first conductive material through any such exposed surface protrusions; and
   removing the second material to expose the layer of first conductive material including any surface protrusions having heights less than D.

59. The method of claim 58 wherein the conductive material comprises chromium.

60. The method of claim 58 further comprising forming additional components on the exposed layer of first conductive material including any surface protrusions having heights less than D.

61. The method of claim 58 wherein removing the second material to expose the surface protrusion comprises chemical mechanical planarization of the second material.

62. The method of claim 58 wherein removing the layer of first conductive material through any such exposed surface protrusion comprises the process of etching the layer of first conductive material.

63. The method of claim 58 wherein removing the second material to expose the layer of first conductive material comprises the process of etching the second material.

64. A process for constructing a field-emission display (FED), comprising the steps of:

- depositing a conductive thin film layer on a substrate in which the thin film layer may have at least one surface protrusion;
- covering the thin film layer with an insulating sacrificial layer having a top surface;
- using chemical-mechanical planarization to remove a portion of the sacrificial layer from the top surface until the sacrificial layer has a thickness D to thereby expose on the top surface all surface protrusions having a height of at least D;
- etching the surface protrusions from the thin film layer through the exposed portions of any such protrusions;
- etching the sacrificial layer to remove the sacrificial layer from the thin film layer;
- constructing emitters on the thin film layer;
- forming a layer of insulating material above the thin film layer;
- forming an extraction grid on the layer of insulating material above the emitters; and
- constructing a transparent screen above the extraction grid, the screen having an anode and a cathodoluminescent coating on the anode facing the extraction grid.

* * * * *